United States Patent
Kashiwaya et al.

[11] Patent Number: 5,595,792
[45] Date of Patent: Jan. 21, 1997

[54] METHOD AND APPARATUS FOR PRODUCING MAGNETIC RECORDING MEDIUM

[75] Inventors: Makoto Kashiwaya; Junji Nakada, both of Kanagawa, Japan

[73] Assignee: Fuji Photo Film Co., Ltd., Kanagawa, Japan

[21] Appl. No.: 518,177

[22] Filed: Aug. 23, 1995

[30] Foreign Application Priority Data

Aug. 24, 1994 [JP] Japan .................................. 6-220857

[51] Int. Cl.$^6$ ...................................................... H05H 1/02
[52] U.S. Cl. ........................... 427/570; 118/47; 118/50.1;
118/620; 118/718; 118/723 MW; 118/723 VE;
427/129; 427/130; 427/131; 427/132; 427/249;
427/255.5; 427/294; 427/404; 427/407.1;
427/419.2; 427/575; 427/577
[58] Field of Search ...................................... 427/570, 575,
427/577, 128–132, 294, 249, 255.5, 404,
419.2, 407.1; 118/47, 71 B, 723 VE, 723 MW,
729, 50.1, 620

Primary Examiner—Bernard Pianalto
Attorney, Agent, or Firm— Sughrue, Mion, Zinn, Macpeak & Seas

[57] ABSTRACT

A method and apparatus for producing a magnetic recording medium in which production of flakes in a film-forming process and the occurrence of arc discharge in the film-forming surface of a substrate are prevented to thereby attain improvement in the quality of the resulting film and in producing efficiency. A web-like substrate is made to run in a vacuum chamber while the substrate is arranged opposite to a sheet-shaped plasma stream. At the same time, a reactive gas is supplied to the plasma stream while an electric field is generated in a direction crossing the plasma stream and the substrate, which are arranged opposite to each other to thereby form a thin film on the plasma stream side surface of the substrate. Accordingly, the production of flakes is prevented, so that the occurrence of arc discharge in the film-forming surface of the substrate is prevented.

23 Claims, 4 Drawing Sheets

METHOD AND APPARATUS FOR PRODUCING MAGNETIC RECORDING MEDIUM

BACKGROUND OF THE INVENTION

The present invention relates to a method and apparatus for producing a magnetic recording medium, in which, while a reactive gas is supplied to a sheet-shaped plasma stream formed in a vacuum chamber, a web-like substrate, which is a constitutional element of a magnetic recording medium, is made to run in the vicinity of the plasma stream so that a thin film of predetermined components is formed on a plasma stream side surface of the substrate by gas-phase reaction of the reactive gas on the plasma stream.

For example, magnetic tape, which is one type of magnetic recording medium, can be generally classified into a magnetic tape having a magnetic layer formed by a coating method and a magnetic tape having a magnetic layer formed by a vapor deposition method.

A magnetic layer formed by vapor deposition is capable of high recording density, and thus a high image quality, but its running durability is low compared with a magnetic layer formed by a coating method.

Therefore, in order to improve the running durability of a magnetic layer formed by a vapor deposition method, a technique has been proposed in which a diamond-like carbon film is formed with a thickness ranging from approximately 50 Å to approximately 200 Å on the magnetic layer to act as a protective layer. (See, for example, Japanese Patent Unexamined Publication No. Sho. 61-210518).

As the aforementioned method for forming a diamond-like carbon film, various plasma CVD (Chemical Vapor Deposition) methods using glow discharge and arc discharge have been proposed heretofore. For example, various methods using radio frequency glow discharge (see Japanese Patent Unexamined Publication No. Sho-63-279426) have been proposed as the method using glow discharge, and various methods using DC arc discharge have been proposed as the method using arc discharge.

In the case where radio frequency glow discharge is used, however, the electron density of the plasma is low so that the deposition rate is low. There thus arises a problem that the production efficiency is low.

Further, a reaction tube must be shaped circularly because of the shape of an induction coil used for generating radio frequency glow discharge. This is unsuitable in the case where the formation of a uniform film over a predetermined width is required, as in the case where the film is formed on a web-like substrate.

Further, in the case where the film-forming process is continued for a long time because of the use of such a reaction tube, the film accumulated in the reaction tube is peeled and mixed as flakes into the film-forming portion of the substrate. For this reason, there may arise defects such as pinholes or the like whereby the film is rendered locally discontinuous, leading to signal dropout.

Further, there has been a risk that film deposited at the outlet of the reaction tube may damage the surface of the substrate.

On the other hand, the method using DC arc discharge is suitable for high deposition rate because the electron density of the plasma is high compared with the case using glow discharge. Further, the method is suitable for the formation of a large-area film because the plasma stream can be shaped into a sheet-shaped configuration by a magnetic field. Accordingly, the method is advantageous also in the case where the formation of a uniform film over a predetermined width is required, as in the case where the film is formed on a web-like substrate.

Therefore, in order to best take advantage of the aforementioned merits of DC arc discharge for a process of forming a diamond-like carbon film, there has been proposed a vacuum film-forming apparatus which is configured by combining a plasma stream generating device for forming a sheet-shaped plasma stream and a web transporting device for running a web-like substrate in the vicinity of the plasma stream.

FIG. 4 shows a conventional example of the aforementioned vacuum film-forming apparatus 1. The apparatus 1 includes a vacuum chamber 3 having a vacuum pump 2 for providing a vacuum atmosphere for the film-forming process, a plasma stream generating device (plasma gun) 5 for forming a sheet-shaped plasma stream 4 in the vacuum chamber 3, a gas supply 6 for supplying a reactive gas to the plasma stream 4, and a substrate transporting device 8 for causing the substrate 7 run in the vacuum chamber 3 in such a manner that a surface (film-forming surface) of the web-like substrate 7 is arranged opposite the plasma stream 4.

The aforementioned substrate transporting device 8 includes an un-winder 10 for delivering the substrate 7 from its wound form, a film-forming drum 11 which delivers the film-forming surface of the substrate from the un-winder 10 while maintained in a state in which the substrate 7 is arranged opposite the plasma stream 4, a take-up device 12 for taking up the processed substrate 7, and electrode rolls arranged in the vicinity of the film-forming drum 11 so as to be pressed by the substrate 7. A DC electric source 14 is connected to the electrode rolls 13 as a bias electric source so as to apply a voltage for accelerating the ionized reactive gas.

However, the electron temperature of plasma generated by DC arc discharge is low so that it may be impossible to ionize and excite the reactive gas sufficiently. Therefore, in the conventional case, as shown in FIG. 4, a bias voltage is applied through the electrode rolls 13 so that the ionization/excitation of the reactive gas is activated.

As shown in FIG. 4, in the case where the bias voltage is a DC voltage, however, arc discharge occurs in the surface of the substrate during the film-forming process because of the application of the bias voltage, as a result of which the quality of the resulting film may be low if, for example, an electrically insulating film such as a diamond-like carbon film is to be formed.

Therefore, it may be thought that the lowering of the quality caused by the occurrence of arc discharge could be avoided by using a radio frequency voltage as a bias voltage instead of the DC voltage. As shown in FIG. 4, in the structure in which the bias voltage is applied through the electrode rolls 13, however, the radio frequency voltage acting on the film-forming surface of the substrate 7 cannot be made uniform. There then arises another problem that the variation of the film thickness distribution is widened because of the variation of the intensity of electric field caused by the variation of the radio frequency voltage.

SUMMARY OF THE INVENTION

Accordingly, an object of the present invention is to solve the aforementioned problems, that is, to provide a method and apparatus for producing a magnetic recording medium in which when a film such as a diamond-like carbon film is to be formed, not only the production of flakes in the film-forming process is prevented so that the occurrence of defects such as pinholes or the like, caused by mixing of the flakes, can be avoided, but also the lowering of quality caused by the production of arc discharge in the film-forming surface of the substrate, the variation of the intensity of electric field acting on the film-forming surface, and the like can be prevented so that high-quality and high-efficiency film-forming can be attained.

The foregoing and other objects of the present invention can be achieved by a method for producing a magnetic recording medium in which while a reactive gas is supplied to a sheet-shaped plasma stream formed in a vacuum chamber, a web-like substrate is made to run in the vicinity of the plasma stream so that a thin film of predetermined components is formed on a plasma stream side surface of the substrate by gas-phase reaction of the reactive gas on the basis of the plasma stream, characterized by the steps of: running the substrate through the vacuum chamber while providing a vacuum environment for a film-forming process with the substrate arranged opposite to the plasma stream, and forming a thin film while generating an electric field in a direction crossing the plasma stream and the substrate which are arranged opposite to each other.

Further, in the aforementioned method for producing a magnetic recording medium, the foregoing object can be achieved by a structure in which the electric field generated in a direction crossing the plasma stream and the substrate, which are arranged opposite to each other, is formed by means of radio frequency electrodes.

Further, in the aforementioned method for producing a magnetic recording medium, the foregoing object can be achieved by a structure in which the substrate is made to run along one face of the sheet-shaped plasma stream and then returns to run along the other face of the plasma stream to thereby obtain a state in which the substrate is arranged opposite to the plasma stream, and at the same time, an envelope space obtained by enclosing the plasma stream with the substrate is formed so that the reactive gas is supplied into the envelope space.

Still further, the foregoing object can be achieved by an apparatus for producing a magnetic recording medium in which, while a reactive gas is supplied to a sheet-shaped plasma stream formed in a vacuum chamber, a web-like substrate is made to run in the vicinity of the plasma stream so that a thin film of predetermined components is formed on a plasma stream side surface of the substrate by gas-phase reaction of the reactive gas on the basis of the plasma stream, the apparatus characterized by comprising:

a vacuum chamber for providing a vacuum environment for a film-forming process;

a plasma stream generating means for forming a sheet-shaped plasma stream in the vacuum chamber;

a gas introduction means for supplying a reactive gas to the plasma stream;

a substrate carrying means for making the web-like substrate run in the vacuum chamber so that a surface of the substrate is arranged opposite to the plasma stream; and an electric field forming means for generating an electric field in a direction crossing the plasma stream and the substrate which are arranged opposite to each other.

Further, in the aforementioned apparatus for producing a magnetic recording medium, the foregoing object can be achieved by a structure in which the electric field forming means generates the electric field in a direction crossing the plasma stream and the substrate, which are arranged opposite to each other, by means of radio frequency electrodes arranged along the running substrate opposite to the plasma stream.

According to the aforementioned configuration of the present invention, an electric field for activating ionization/excitation of the reactive gas during the film-forming process is generated in a direction crossing the plasma stream and the substrate, which confront each other. Accordingly, it becomes easy to make the intensity of electric field uniform over a wide range, so that lowering of the quality of the film caused by the variation of the intensity of electric field, or the like can be prevented.

Further, the electric field is generated by application of a bias voltage. In the configuration in which the bias voltage is made a radio frequency voltage due to radio frequency electrodes, ionization/excitation of the reactive gas can be activated well without risk of occurrence of arc discharge as in the case where a DC voltage is applied.

Further, in the configuration in which the substrate is made to run along one face of the sheet-shaped plasma stream and then turns to run along the other face of the plasma stream to thereby obtain a state in which the substrate confronts the plasma stream and at the same time an envelope space is formed by enclosing the plasma stream in the substrate so that the aforementioned reactive gas is supplied into the envelope space, there is no necessity to provide a reaction tube exclusively used for preventing unnecessary diffusion of the reactive gas. As a result, the number of areas in which the accumulated film is peeled is reduced, so that flakes formed by peeling-of the film are prevented from mixing into the film-forming portion. Accordingly, problems such the occurrence of pinholes and the like can be prevented.

DESCRIPTION OF THE PREFERRED EMBODIMENTS

Preferred embodiments of the present invention will be described below with reference to the drawings.

Figure 1:
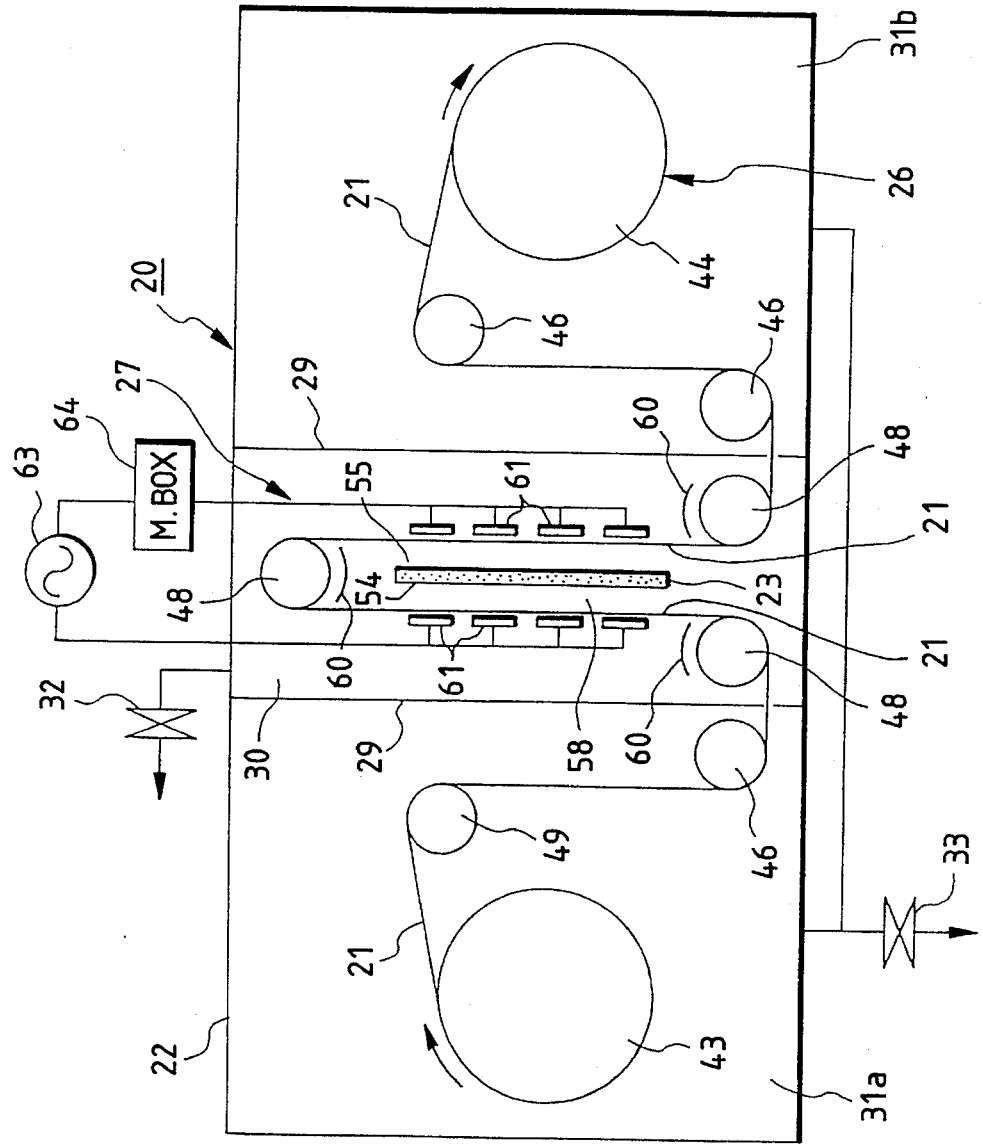
FIG. 1 is a front view of a preferred embodiment of an apparatus for producing a magnetic recording medium according to the present invention.
Figure 2:
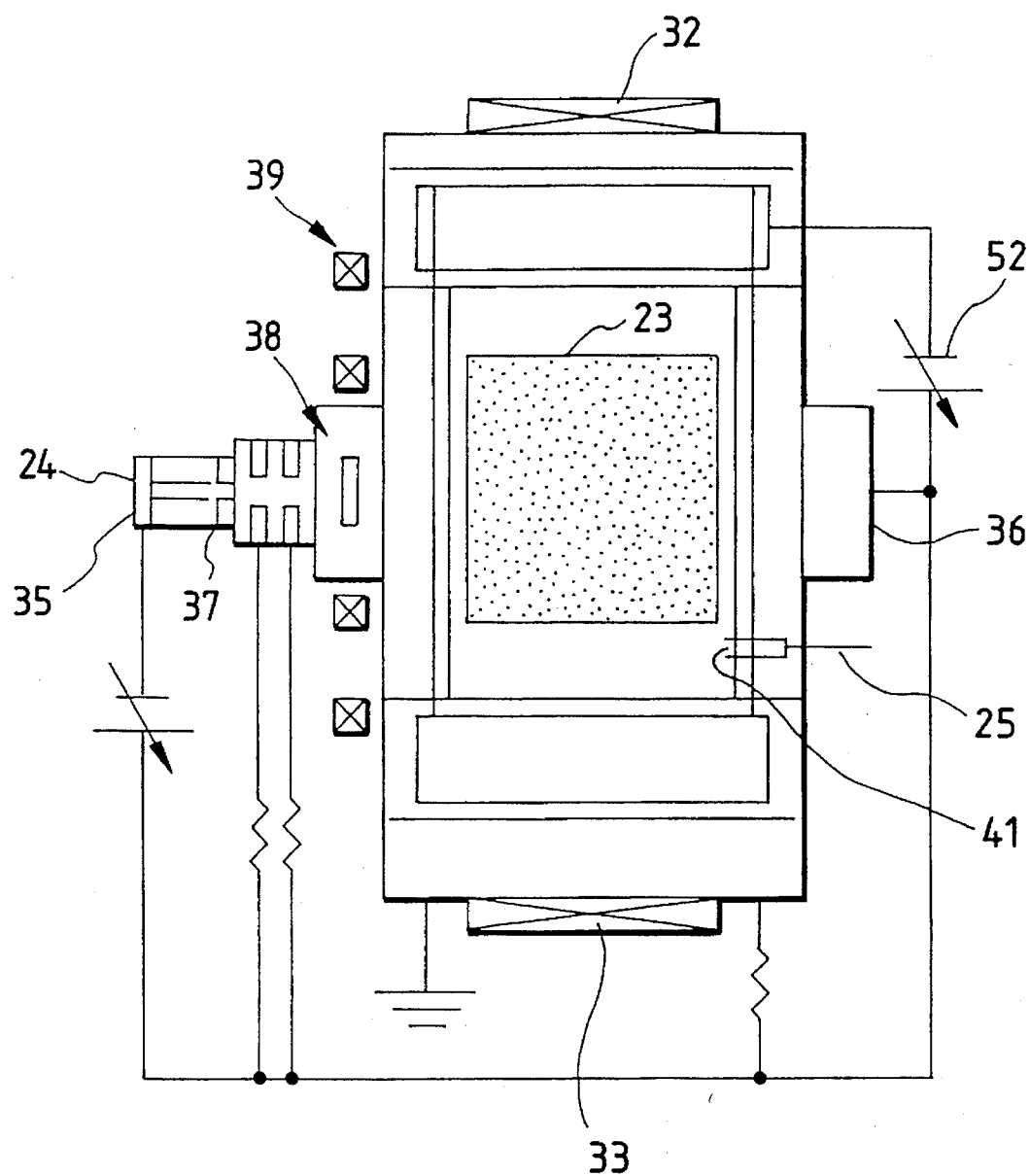
FIG. 2 is a side view of an embodiment of an apparatus for producing a magnetic recording medium according to the present invention.

FIGS. 1 and 2 show an embodiment of an apparatus for producing a magnetic recording medium according to the present invention.

In this embodiment, the magnetic recording medium producing apparatus 20 is designed so that a thin film of a predetermined component is formed by a plasma CVD method on a surface of a long web-like substrate 21, which is a constituent element of a magnetic tape. The apparatus 20 includes a vacuum chamber 22 for providing a vacuum atmosphere for a film-forming process, a plasma stream generating device 24 for forming a sheet-shaped plasma stream (sheet plasma) 23 in the vacuum chamber 22, a gas supply 25 for supplying a reactive gas to the plasma stream 23, a substrate transporting device 26 for running the substrate 21 within the vacuum chamber 22 arranged such that the surface of the substrate 21 faces the plasma stream 23, and an electric field generating device 27 for generating an electric field in a direction perpendicular to the plasma stream 23 and the substrate 21, which confront each other.

The aforementioned vacuum chamber 22 is a hermetically sealed vessel formed of a nonmagnetic material. As the nonmagnetic material, for example, SUS304, aluminum, copper, or the like, can be used. The material is selected corresponding to the size of the tank, the required strength, or the like.

In the case of this embodiment, the vacuum chamber 22 is partitioned into three chambers by seal plates 29. The intermediate chamber is a film-forming chamber 30 in which the aforementioned plasma stream 23 is formed and in which a reactive gas is supplied to the plasma stream 23. Chambers located on both sides of the intermediate chamber are a delivery chamber 31a for delivering the substrate 21 to the film-forming chamber 30 and a take-up chamber 31b for taking up the substrate 21 which has passed through the film-forming chamber 30.

It is necessary that the aforementioned film-forming chamber 30 be kept in a higher vacuum state than the chambers 31a and 31b located on both sides thereof. Therefore, a vacuum pump 32 for evacuating the film-forming chamber 30 and a vacuum pump 33 for evacuating the chambers 31a and 31b are provided independently.

For each of the vacuum pumps 32 and 33, in order to reduce the amount of residual gas, which may deteriorate the quality of film, there may be used a pump having an air-exhausting characteristic in which the vacuum chamber 22 can be evacuated to an atmosphere of not larger than $7 \times 10^{-5}$ Torr, preferably, not larger than $5 \times 10^{-6}$ Torr, initially, and with which the vacuum chamber 22 can be kept in a range of from $1 \times 10^{-1}$ to $1 \times 10^{-4}$ Torr by introduction of a reactive gas during the film-forming process.

In the case of this embodiment, evacuation by the vacuum pump 32 is executed from the rear surface side of the substrate 21 to provide a difference between the pressure in an envelope space 58 (described later) formed by the substrate 21 in the film-forming chamber 30 during the film-forming process and the pressure on the outside thereof (that is, on the rear surface side of the running substrate 21) to thereby prevent deposition of the reactive gas component on the rear surface side of the substrate 21, or the like. During the film-forming process, in practice, the pressure on the plasma side of the substrate 21 is set to be in a range of $1 \times 10^{-3}$ to $1 \times 10^{-2}$ Torr and the pressure on the rear surface side of the substrate 21 is set to be not larger than the range (preferably, not larger than $5 \times 10^{-4}$ Torr). The pressure difference between the plasma side of the substrate 21 and the rear surface side thereof is preferably set to be large in order to prevent the deposition of the reactive gas component onto the rear surface side of the substrate 21, or the like.

For this purpose, the aforementioned vacuum pumps 32 and 33 may be a turbo pump, a mechanical booster pump, a rotary pump, etc., used in combination as needed. Otherwise, a cryopump or a diffusion pump may be used instead of a turbo pump.

The width size (the size in a direction perpendicular to the surface on which FIG. 1 is drawn) of the aforementioned plasma stream 23 is generally set corresponding to the width of the substrate 2, so that the plasma stream 23 is generally shaped like a sheet, for example, having a width of about 200 to about 300 mm.

The aforementioned plasma stream generating means 24 generates a plasma stream 23 having electron density of not lower than $10^{11}/cm^3$, preferably, not lower than $10^{12}/cm^3$. In the case of this embodiment, a sheet-shaped plasma stream 23 which is directed toward an anode 36 from a plasma gun 37 having a cathode 35 is provided. The plasma stream discharged from the plasma gun 37 is, for example, an axial flow having a circular shape in transverse section. In order to widen the plasma stream to a flat shape like a sheet, there is provided a sheet-forming magnet 38 for applying a magnetic field to the plasma stream discharged from the plasma gun 37. Further, in order to keep the flow of the plasma stream 23 within the vacuum chamber 22 stable, there is provided an air-core coil (focusing coil) 39 having an external diameter of 300 to 500 mm, as shown in the drawing.

The aforementioned gas supply 25 supplies 1 to 2 kgf/cm² of reactive gas from the side surface side of the vacuum chamber 22 toward the sheet-shaped plasma stream 23 through a nozzle 41 penetrating into the vacuum chamber 22, with the flow rate of the reactive gas controlled by means of a mass flow controller (not shown). The nozzle 41 is arranged on the upstream side of the sheet-shaped plasma stream 23.

The nozzle 41 may be formed by machining an SUS pipe or copper pipe. Further, the opening shape of the nozzle 41, the size thereof, the number of nozzles provided, the quantity of reactive gas supplied, etc., are selected to be optimum values corresponding to the width sizes of the substrate 21 and the plasma stream 23, or the like, so that the partial pressure of the gas around the plasma stream 23 is made uniform.

The aforementioned substrate transporting device 26 includes a un-winder 43 for delivering the substrate 21 from the wound state, a winder 44 for taking up the substrate 21 delivered from the un-winder 43, rolls 46 arranged in the chambers 31a and 31b in order to limit the position of the running of the substrate 21 delivered from the un-winder 43 and taken up by the winder 44, three rolls 48 arranged in the film-forming chamber 30 in order to limit the position of the running of the substrate 21 in the film-forming chamber 30, a driving unit (not shown) for driving the aforementioned devices 43 and 44 and rolls 46, 48 and 49 to rotate, and a driving controller (not shown) for controlling the operation of the driving unit.

In the case of a roll 49 near the un-winder 43, the roll 49 is configured so as to function as an electrode roll whereby a DC voltage is supplied to the surface of the substrate 21 from the surface of the roll made of a metal material to charge the surface of the substrate 21 with electricity to thereby promote film-forming. The application of the voltage to this electrode roll is made by means of a DC bias electric source 52. The bias electric source 52 is capable of applying a DC voltage of 0 to 1000 V with either negative or positive polarity.

Further, as shown in FIG. 1, the three rolls 48 arranged in the film-forming chamber 30 limit the position of the running of the substrate 21 so that the substrate 21 is made to run along one face 54 of the sheet-shaped plasma stream 23, and then turn so as to run along the other face 55 of the sheet-shaped plasma stream 23. By the limitation of the position of the running of the substrate 21 due to the aforementioned rolls 48, the film-forming surface of the substrate 21 and the sheet-shaped plasma stream 23 are made parallel with each other so as to confront each other, and the periphery of the plasma stream 23 forms an envelope space 58 surrounded by the substrate 21. Further, the reactive gas is supplied by means of the gas supply 25 into the envelope space 58.

The three rolls 48 located at the turn position at which the roll 48 is arranged directly opposite the plasma stream 23 may be preferably arranged to be as far from the plasma stream 23 as possible so that film is not deposited or accumulated on the roll 48 during the film-forming process, In the case of this embodiment, not only is the roll 48 arranged far from the plasma stream 23, but also an masking plate 60 is interposed between the roll 48 and the plasma stream 23 to thereby prevent the film from being deposited or accumulated on the roll 48. On the other hand, a method in which a positive-polarity voltage is applied to the masking plates 60 to prevent the deposition of the film onto the roll 48, or the like, may be employed. In the case where this method is used, care must be taken so that the masking plate 60 is not made an anode for arc discharge.

Further, as shown in FIG. 1, the three rolls 48 arranged in the film-forming chamber 30 are equipped with masking plates 60 by which components of the gas decomposed by gas-phase reaction are prevented from being deposited on the rolls. These masking plates 60 prevent the substrate 21 from being abraded by the gas components deposited on the rolls and prevent the quality of the film from being lowered because of staining of the film-forming surface of the substrate 21.

The aforementioned electric field generating device 27 is designed to generate an electric field in a direction perpendicular to the plasma stream 23 and the substrate 21 running in the opposite sides of the plasma stream 23 by supplying a radio frequency voltage from a radio frequency electric source 63 to parallel flat-plate-shaped radio frequency electrodes 61 arranged at intervals of a predetermined distance along the substrate 21 in the outside of the substrate 21 located in the opposite sides of the plasma stream 23. A matching box 64 is provided in an electric line between the radio frequency electric source 63 and the radio frequency electrodes 61 so that the quantity of reflection waves generated is adjusted by impedance matching.

The widthwise (in the direction perpendicular to the surface on which FIG. 1 is drawn) size of the aforementioned radio frequency electrodes 61, the number of the radio frequency electrodes 61 arranged, etc., are determined to be optimum values by taking into account the width of the substrate 21, the width of the plasma stream 23, the size of the film-forming range, etc. Further, the distance between the running substrate 21 and the radio frequency electrodes 61 is made adjustable in a range of from about 0.1 to about 5 mm. If the distance between the substrate 21 and the radio frequency electrodes 61 is too large, electric discharge may be produced between the substrate 21 and the radio frequency electrodes 61 so that the rear surface of the substrate 21 may be damaged by ions. Therefore, it is necessary that the distance between the substrate 21 and the radio frequency electrodes 61 be adjusted to an optimum value.

For the aforementioned radio frequency electric source 63, there may be selected an electric source in which the maximum output is not larger than about 3 kW and in which a required output is obtained corresponding to the surface area of the radio frequency electrodes 61. Further, the frequency of the radio frequency voltage applied to the radio frequency electrodes 61 may be preferably selected to be a suitable value in a range of from 2 to 100 MHz by using the aforementioned matching box 64.

In a case where the substrate 21 is provided for a magnetic recording medium of a type in which a magnetic layer of a ferromagnetic substance is formed in the film-forming surface side of the substrate 21 in advance, a DC voltage is applied to the substrate 21 by means of the aforementioned electrode rollers 46 during the film-forming process. For example, in the case where there is no electrically conductive layer formed in the substrate 21 or in the case where there is no DC electric source, a negative-polarity DC voltage can be applied to the substrate 21 by a self-bias voltage due to radio frequency electric discharge without application of any DC voltage if blocking capacitors are arranged between the radio frequency electrodes 61 and the radio frequency electric source 63, and further the heightwise length of the one-sided electrodes is shortened to reduce the surface area thereof. In this case, ion seeds of the reactive gas generated by the plasma stream 23 are accelerated toward the one-sided electrodes, so that the film can be formed on only one side of the substrate 21 and so that the self bias voltage can be made high as long as the radio frequency electric power is made high. Because the temperature of the substrate 21 rises at the same time, cooling may be carried out as occasion demands if, for example, the film material used in the substrate 21 is PET, PEN, or the like.

The method for producing a magnetic recording medium according to the present invention is carried out by means of the producing apparatus 20 configured as described above.

Figure 3:
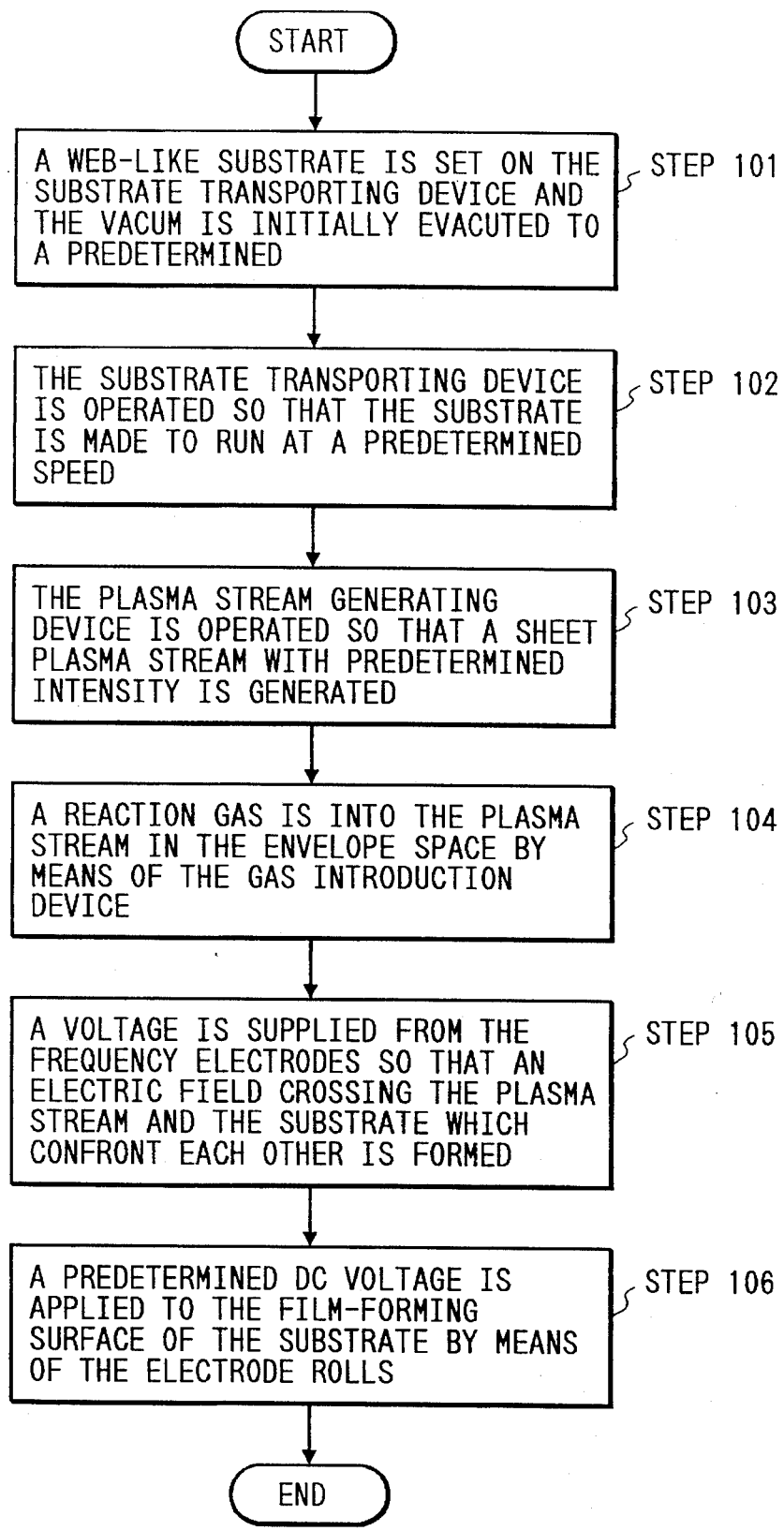
FIG. 3 is a flow chart showing a process up to execution of film-forming in a method for producing a magnetic recording medium according to the present invention.
Figure 4:
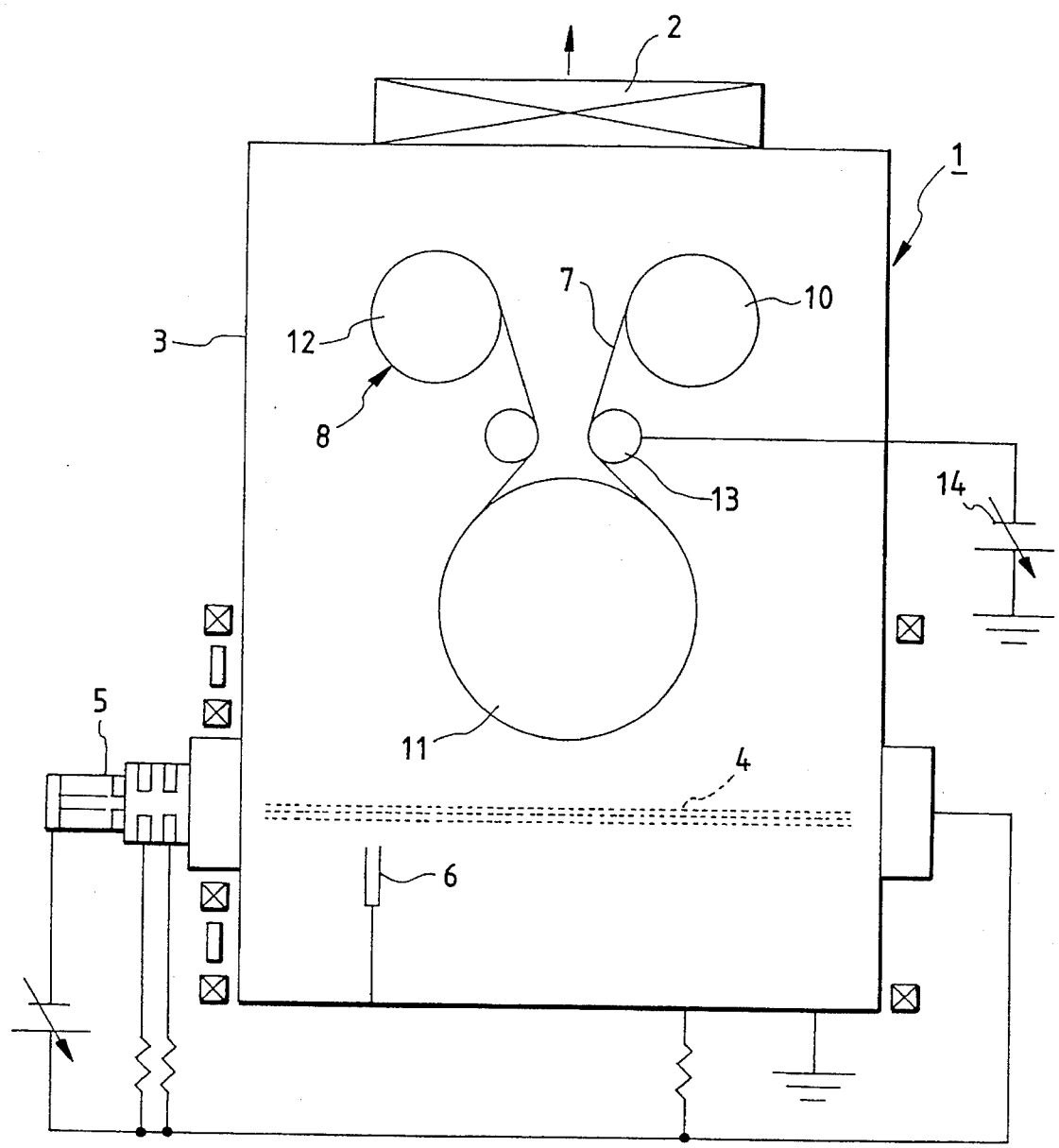
FIG. 4 is a front view of a conventional apparatus for producing a magnetic recording medium.

FIG. 3 shows an example of a process carried out at the time of the starting of the film-forming process by means of the aforementioned producing apparatus 20.

First, a web-like substrate 21 is set on the substrate transporting device 26, and the vacuum chamber 22 is initially evacuated to a predetermined pressure by means of the vacuum pumps 32 and 33 while a predetermined amount of tension is applied to the substrate 21 (step 101).

Then, the substrate transporting device 26 is operated so that the substrate 21 is made to run at a predetermined speed (step 102).

Then, the plasma stream generating device 24 is operated so that a sheet-shaped plasma stream 23 with predetermined intensity is generated at a predetermined position in the film-forming chamber 30 (step 103).

Then, a reactive gas at a predetermined flow rate is introduced into the plasma stream 23 in the envelope space 58 by means of the gas supply 25 (step 104).

Then, a predetermined radio frequency voltage is supplied from the radio frequency electrodes 61 so that an electric field crossing the plasma stream 23 and the substrate 21 which confront each other is produced (step 105).

Then, a predetermined DC voltage is applied to the film-forming surface of the substrate 21 by means of the electrode rolls 49 (step 106).

Although film-forming is executed by the aforementioned process, the sequence of steps 102 to 106 is not limited to the sequence shown in the drawing and the sequence can be changed suitably corresponding to the required performance of the apparatus, so that a large part of the substrate 21 does not run before film-forming is executed.

In the aforementioned film-forming executed by means of the producing apparatus 20, the electric field for activating the ionization/excitation of the reactive gas at the time of the film-forming process is generated in a direction crossing the plasma stream 23 and the substrate 21 which confront each other. Accordingly, it is easy to make the intensity of electric field uniform over a wide range, so that lowering of the quality of the film caused by a variation of the intensity of electric field or the like can be prevented.

The electric field is generated by application of a bias voltage. Because the bias voltage is made a radio frequency voltage due to the radio frequency electrodes 61, the ionization/excitation of the reactive gas can be activated well without any risk of generation of arc discharge as in the case where a DC voltage is applied.

Further, the configuration is such that the substrate 21 is made to run along one face of the sheet-shaped plasma stream 23 and then turns to run along the other face of the plasma stream 23 to thereby obtain a state in which the substrate confronts the plasma stream 23 and at the same time forms an envelope space 58 obtained by enclosing the plasma stream 23 in the substrate 21 so that the aforementioned reactive gas is supplied into the envelope space 58. Accordingly, there is no need to provide a reaction tube exclusively used for preventing the unnecessary diffusion of the reactive gas. As a result, the number of portions in which the accumulated film is peeled is reduced, so that flakes formed by peeling of the film are prevented from mixing into the film-forming portion. Accordingly, disadvantages such as occurrence of pinholes and the like can be prevented.

Accordingly, when, for example, a diamond-like carbon film or the like is to be formed, not only is the production of flakes in the film-forming process prevented so that the occurrence of defects such as pinholes caused by mixing of the flakes can be avoided, but also lowering of the quality of the film caused by the occurrence of arc discharge in the film-forming surface of the substrate 21, variation of the intensity of the electric field acting on the film-forming surface, and the like can be prevented so that a high-quality film can be formed with high production efficiency.

The inventors carried out a film-forming test using the producing apparatus 20 of the aforementioned embodiment. Details of specifications of the producing apparatus 20 used were as follows.

The configuration was such that an SUS304 material with an internal volume of about 1.5 m³ was provided as the vacuum layer 22, and two turbo pumps having evacuation capacities of 3000 liters/sec and 5000 liters/sec, one mechanical booster pump having an evacuation capacity of 25,000 liters/min and one rotary pump having an evacuation capacity of 1500 liters/min were provided as the vacuum pumps 32 and 33.

Further, masking plates, each of which was configured so that cooling water was poured into a copper pipe attached to a copper plate, were used in portions of the vacuum chamber 22 which were apt to be easily damaged by heat due to plasma, if the occasion should arise. Further, the outer wall of the vacuum chamber 22 was cooled if the occasion should arise.

Further, evacuation was performed so that the pressure at initial evacuation was not higher than $5 \times 10^{-6}$ Torr and that the pressure in a range of $1 \times 10^{-3}$ to $1 \times 10^{-2}$ Torr and the pressure not higher than $5 \times 10^{-4}$ Torr were obtained in the film-forming portion within the envelope space 58, as well as in the other portions, during the film-forming process.

Further, a pressure gradient type device having a composite cathode of Ta-LaB$_6$ and an intermediate electrode was used as the plasma stream generating device 24 so that plasma was shaped like a sheet by magnetic field. A plasma gun having a maximum discharging current of 200 A was used. Further, an anode provided with a 5 mm-thick Mo plate attached to the surface thereof was arranged.

As the bias electric source 52 for the electrode rollers 46, there was used a DC electric source capable of applying minus or plus-polarity 1000 V at the maximum.

A mass flow controller with a maximum flow rate of from 100 to 500 sccm was used in the gas supply 25 to control the flow rate of the reactive gas, and a material obtained by machining a 6 mm-diameter SUS pipe was used as the nozzle 41 for supplying the reactive gas.

In the substrate transporting device 26, rolls having a width of 320 mm and a diameter of 100 to 150 mm were used as the rolls 46 and 48 so that a substrate 21 having a width of 300 mm could be made to run. Further, a mounting mechanism on which a core having an external diameter of 160 mm could be mounted was used in each of the un-winder 43 and the winder 44.

Further, during the film-forming process, the rotational speed, etc., of the un-winder 43 and the winder 44 were controlled so that the running speed of the substrate 21 in the film-forming chamber 30 was kept constant. Specifically, a motor of 4.0 kW was used as a take-up driving motor, and the running speed of the substrate 21 during the film-forming process was selected to be a suitable value in a range of 5 to 200 m/min. The tension acting on the substrate 21 was selected to be a suitable value in a range of 3 to 15 kgf/w.

For the aforementioned radio frequency electric source 63, there was used an electric source having a frequency of 13.56 MHz and maximum output of 3 kW. Further, as each of the radio frequency electrodes 61, there was used an SUS304 plate having a width of 300 mm, a length of 50 mm and a thickness of 2 mm. The distance between the rear surface of the running substrate 21 and the radio frequency electrodes 61 was selected to be a suitable value in a range of from 0.1 to 5 mm.

For the matching box 64 for performing impedance matching of the radio frequency electric source 63, there was used an inverted L-type.

Further, other conditions in the test executed by means of the apparatus of the aforementioned specifications were as indicated in the following paragraphs (1) to (5).

(1) Discharge Gas

Ar was used, and 20 to 100 sccm of Ar was introduced into the plasma gun.

(2) Discharge Output

The discharge voltage was selected to be in a range of from 60 to 120 V, and the discharge current was selected to be in a range of from 100 to 150 A.

(3) Web-like Substrate 21

There was used a substrate obtained by forming a 2000 Å thick Co-O layer on a PET base having a thickness of 5 to 20 μm by means of vapor deposition in advance. A negative-polarity voltage of 0 to 800 V was applied to the film-forming surface of the substrate. Further, the distance from the center of the plasma stream to the film-forming surface was selected to be in a range of from 50 to 75 mm.

The carrying speed and tension were selected to be in a range of from 20 to 40 m/min and a value of 6 kgf/w, respectively.

(4) Reactive gas

Hydrocarbon gas such as $CH_4$, $C_2H_6$, $C_3H_8$ or $C_2H_2$ was used, and 50 to 200 sccm of the hydrocarbon gas was introduced.

(5) Radio Frequency

The distance between the radio frequency electrodes and the substrate was selected to be in a range of from 0.5 to 1 mm. Further, the supplied electric power was selected to be in a range of 0 to 3 W/cm². The reflected wave was made 20% or less by the adjustment of impedance due to the matching box 64.

Samples subjected to film-forming under the aforementioned specifications and conditions were evaluated as to film thickness, hardness, film quality, film thickness distribution, deposition rate and stain of vacuum layer.

As for the film thickness, sections were observed by TEM (Transmission Electron Microscopy) and the following expression $$(\max-\min)/(\max+\min)\times 100 \quad (1)$$

was calculated as the film thickness distribution (unit: %) on the basis of the maximum and minimum values of the widthwise thickness of the substrate 21. Further, as for the hardness, Vickers hardness was measured using a thin-film hardness meter. As for the film quality, plasmon loss energy by ESCA (Electron Spectroscopy for Chemical Analysis) was used. This was a method in which plasmon losses of amorphous, graphite and diamond were measured in advance, and a judgment was made as to which phase corresponded to the film-forming sample. In this embodiment, a value of 25 to 27 eV was employed as the optimum value of the carbon protective film for a magnetic recording medium. The deposition rate was calculated on the basis of the film thickness in the widthwise center position of the substrate 21, the carrying speed of the substrate 21 and the film-forming region of the substrate 21. Further, as for the stain of the vacuum layer, flakes generated in the vacuum chamber were collected and the weight thereof was compared with that in the case where film-forming was performed by means of the conventional apparatus.

The following Table 1 shows a list of these film-forming conditions and measurement results. (Evaluation on the stain of the vacuum layer is, however, not shown in Table 1.)

In evaluating the stain of the vacuum layer, in any test case, the quantity of flakes generated was reduced to $1/10$ or less compared with the conventional method. Further, even in the case of continuous running, particularly the quantity of the film deposited on the masking plates 60 for protecting the rollers 48 in the film-forming chamber 30 was reduced to a very small quantity so that there was no occurrence of failures such as scratches of the running substrate on the film deposited on the masking plates 60, compared with the conventional method.

TABLE 1

| Discharge gas/flow rate sccm | Reactive gas/flow rate sccm | Voltage applied to web V | Radio frequency electric power density W/cm$^2$ | Deposition rate Å/sec | Film Thickness distribution % | Plasmon loss energy eV | Vickers hardness kg/mm$^2$ |
|---|---|---|---|---|---|---|---|
| 1) Ar 30 | CH$_4$ 60 | −400 | 1.2 | 50 | 5.0 | 26.0 | 2000 |
| 2) Ar 30 | C$_2$H$_6$ 60 | −400 | 1.2 | 100 | 7.0 | 26.0 | 2000 |
| 3) Ar 30 | C$_3$H$_8$ 60 | −400 | 1.2 | 150 | 7.0 | 26.0 | 2000 |
| 4) Ar 30 | C$_2$H$_2$ 60 | −400 | 1.2 | 100 | 5.0 | 26.0 | 2000 |
| 5) Ar 30 | CH$_4$ 100 | −400 | 2.5 | 100 | 6.0 | 27.0 | 2500 |

TABLE 2

| Discharge gas/flow rate sccm | Reactive gas/flow rate sccm | Voltage applied to web V | Radio frequency electric power density W/cm² | Deposition rate Å/sec | Film Thickness distribution % | Plasmon loss energy eV | Vickers hardness kg/mm² |
|---|---|---|---|---|---|---|---|
| 6) Ar 30 | C₂H₂ 100 | −400 | 2.5 | 150 | 6.0 | 27.0 | 2500 |
| 7) Ar 30 | CH₄ 100 | −600 | 1.5 | 100 | 6.0 | 26.5 | 2300 |
| 8) Ar 30 | C₂H₂ 100 | −600 | 1.5 | 150 | 6.0 | 26.5 | 2300 |
| 9) Ar 30 | CH₄ 150 | −600 | 2.0 | 100 | 8.0 | 26.5 | 2200 |
| 10) Ar 30 | C₂H₂ 150 | −600 | 2.0 | 150 | 8.0 | 26.5 | 2200 |

Further, as shown in Tables 1 and 2, the carbon protective film formed by means of the aforementioned producing apparatus was provided as a film having a sufficient film quality for a diamond-like carbon film used for a magnetic recording medium. Further, the deposition rate in the conventional film-forming method using radio frequency glow discharge was in a range of from 30 to 40 Å/sec, whereas the deposition rate obtained by the test in this embodiment was in a range of from 50 to 150 Å/sec so that it could be confirmed that high-speed film-forming was possible. Further, the film thickness distribution was narrow in variation thereof, so that it could be confirmed that the film can be used better for the production of a magnetic recording medium or the like.

Although the width size of the plasma stream 23 used in the aforementioned embodiment is in a range of from 200 to 300 mm, it is believed that any one of the following countermeasures (1) to (3) can applied when, for example, a film is to be formed on a wide substrate 21 having a width of 1 m.

(1) A plurality of plasma stream generating means 24 are provided in the direction of the width of the plasma stream 23 to attain the widening of the formed plasma stream. Incidentally, in this case, it is necessary to pay attention to the setting of magnetic field i the vacuum chamber 22 so that plasma streams do not interfere with each other.

(2) Two-stages of magnets are provided like a sheet so that the small-diameter cylindrical plasma just after generation is shaped like a sheet by means of the first-stage magnet, and then the plasma is compressed using the other, widthwise long magnet to enlarge the width of the plasma stream to a predetermined value.

(3) The plasma stream is vibrated along the substrate 21 by scanning the anode to thereby obtain enlargement of the width size. In this case, here is a risk that the film thickness distribution may become irregular if the running speed of the substrate 21 is high.

In the method and apparatus for producing a magnetic recording medium according to the present invention, an electric field for activating ionization/excitation of the reactive gas at the time of the film-forming process is generated in a direction crossing the plasma stream and the substrate, which confront each other. Accordingly, it becomes easy to make the intensity of electric field uniform over a wide range, so that lowering of the quality of the film caused by variation of the intensity of electric field or the like can be prevented.

Further, the electric field is generated by application of a bias voltage. In the configuration in which the bias voltage is made a radio frequency voltage due to radio frequency electrodes, ionization/excitation of the reactive gas can be activated well without risk of discharge, as in the case where a DC voltage is applied.

Further, in the configuration in which the substrate is made to run along one face of the sheet-shaped plasma stream and then turns to run along the other face of the plasma stream to thereby obtain a state in which the substrate confronts the plasma stream and at the same time forms an envelope space obtained by enclosing the plasma stream in the substrate so that the aforementioned reactive gas is supplied into the envelope space, there is no necessity of providing a reaction tube exclusively used for preventing unnecessary diffusion of the reactive gas. As a result, the number of portions in which the accumulated film is peeled is reduced, so that flakes formed by peeling of the film are prevented from mixing into the film-forming portion. Accordingly, disadvantages such as the occurrence of pinholes, etc., can be prevented.

Accordingly, when, for example, a diamond-like carbon film or the like is to be formed, not only is the production of flakes in the film-forming process prevented so that the occurrence of defects such as pinholes, etc., caused by mixing of the flakes can be avoided, but also lowering of the quality of the film caused by the occurrence of arc discharge in the film-forming surface of the substrate, variation of the intensity of electric field acting on the film-forming surface or the like can be prevented, so that a high-quality film can be formed with high production efficiency.

What is claimed is:

1. A method for producing a magnetic recording medium in which, while a reactive gas is supplied to a sheet-shaped plasma stream formed in a vacuum chamber, a web-like substrate is made to run in the vicinity of said plasma stream so that a thin film is formed on a plasma stream side surface of said substrate by gas-phase reaction of said reactive gas on the plasma stream, the method comprising the steps of: running a substrate in a vacuum chamber while providing therein a vacuum atmosphere for a film-forming process with a substrate arranged opposite to a sheet-shaped plasma stream; and forming a thin film while generating an electric field in a direction crossing said plasma stream and said substrate, which are arranged opposite to each other.

2. A method for producing a magnetic recording medium according to claim 1, wherein said electric field generated in a direction crossing said plasma stream and said substrate, which are arranged opposite to each other, is formed by means of radio frequency electrodes.

3. The method for producing a magnetic recording medium according to claim 2, wherein the frequency of the radio frequency voltage applied to the radio frequency electrodes is selected from a range of from 2 to 100 MHz.

4. A method for producing a magnetic recording medium according to claim 2, wherein said substrate runs along one face of said sheet-shaped plasma stream and then returns to run along the other face of said plasma stream to thereby obtain a state in which said substrate is arranged opposite to said plasma stream, and at the same time an envelope space obtained by enclosing said plasma stream with the substrate is formed so that said reactive gas is supplied into said envelope space.

5. The method for producing a magnetic recording medium according to claim 1, wherein said sheet-shaped plasma stream has electron density of not lower than $10^{12}$/cm$^3$.

6. The method for producing a magnetic recording medium according to claim 1, wherein the substrate is provided for a magnetic recording medium of a type in which a magnetic layer of a ferromagnetic substance is formed in the film-forming surface side of the substrate in advance, and a DC voltage is applied to the substrate by means of an electrode rollers during the film-forming process.

7. The method for producing a magnetic recording medium according to claim 1, wherein said sheet-shaped plasma stream has electron density of not lower than $10^{11}$/cm$^3$.

8. The method for producing a magnetic recording medium according to claim 1, wherein said sheet-shaped plasma stream has a width of about 200 to about 300 mm.

9. The method for producing a magnetic recording medium according to claim 8, wherein said vacuum chamber is partitioned into first, second and third chambers by seal plates, the second, intermediate chamber of which is a film-forming chamber in which the plasma stream is formed and in which the reactive gas is supplied to the plasma stream, the first and third chambers located on both sides of the second, intermediate chamber are a delivery chamber for delivering the substrate to the film-forming chamber and a take-up chamber for taking up the substrate which has passed through the film-forming chamber, and the film-forming chamber is kept in a higher vacuum state than the first and third chambers located on both sides thereof, so that a first vacuum pump for evacuating the film-forming chamber and a second vacuum pump for evacuating the first and third chambers are provided independently.

10. The method for producing a magnetic recording medium according to claim 9, wherein, during the film-forming process, the pressure on the plasma side of the substrate is set to be in a range of $1\times10^{-3}$ to $1\times10^{-2}$ Torr and the pressure on the rear surface side of the substrate is set to be not larger than said range.

11. The method for producing a magnetic recording medium according to claim 10, wherein the pressure on the rear surface side of the substrate is set to be not larger than $5\times10^{-4}$ Torr.

12. An apparatus for producing a magnetic recording medium in which while a reactive gas is supplied to a sheet-shaped plasma stream formed in a vacuum chamber, a web-like substrate is made to run in the vicinity of said plasma stream so that a thin film is formed on a plasma stream side surface of said substrate by gas-phase reaction of said reactive gas on the basis of said plasma stream, the apparatus comprising:

a vacuum chamber for providing a vacuum atmosphere for a film-forming process;

a plasma stream generating means for forming a sheet-shaped plasma stream in said vacuum chamber;

a gas supply means for supplying a reactive gas to said plasma stream;

a substrate carrying means for running said web-like substrate in said vacuum chamber in a manner so that a surface of said substrate is arranged opposite to said plasma stream; and an electric field forming means for generating an electric field in a direction crossing said plasma stream and said substrate which are arranged opposite to each other.

13. The apparatus for producing a magnetic recording medium according to claim 12, wherein said electric field forming means generates said electric field in a direction crossing said plasma stream and said substrate arranged opposite to each other, by means of radio frequency electrodes arranged along the running substrate opposite to said plasma stream.

14. The apparatus for producing a magnetic recording medium according to claim 13 wherein the distance between the running substrate and said radio frequency electrodes is made adjustable in a range of from about 0.1 to about 5 mm.

15. The apparatus for producing a magnetic recording medium according to claim 12, further comprising a vacuum pump for evacuating said vacuum chamber and an envelope space formed by said substrate in said vacuum chamber, wherein evacuation by said vacuum pump is executed from a rear surface side of said substrate to provide a difference between a pressure in said envelope space in said vacuum chamber during the film-forming process and a pressure of the outside thereof.

16. The apparatus for producing a magnetic recording medium according to claim 12, wherein said plasma stream generating means comprises a plasma gun having a cathode, and said plasma stream discharged from said plasma gun is an axial flow having a circular shape in transverse section.

17. The apparatus for producing a magnetic recording medium according to claim 16, further comprising a sheet-forming magnet for applying a magnetic field to said plasma stream discharged from said plasma gun.

18. The apparatus for producing a magnetic recording medium according to claim 12, wherein said vacuum chamber is partitioned into first, second and third chambers by seal plates, the second, intermediate chamber performing as a film-forming chamber, and said substrate carrying means comprises:

un-winder for delivering said substrate from the wound state;

a winder for taking up said substrate delivered from said un-winder;

rolls arranged in said first and third chambers for limiting the position of the running of said substrate delivered from said un-winder and taken up by said winder;

three rolls arranged in said film-forming chamber for limiting the position of the running of said substrate in said film-forming chamber;

a driving unit for driving said un-winder, winder, said rolls and said three rolls to rotate; and a driving controller for controlling the operation of said driving unit.

19. The apparatus for producing a magnetic recording medium according to claim 18, further comprising a DC bias electric source for supplying a DC voltage to a surface of said substrate from the surface of said roll made of a metal material to charge the surface of said substrate with electricity to thereby promote film-forming, so that said roll is configured so as to function as an electrode roll.

20. The apparatus for producing a magnetic recording medium according to claim 19, wherein said DC bias electric source applies a DC voltage of 0 to 1000 V with either negative or positive polarity.

21. The apparatus for producing a magnetic recording medium according to claim 18, wherein said three rolls arranged in said film-forming chamber limit the position of the running of said substrate so that said substrate is made to run along one face of said sheet-shaped plasma stream, and then turn so as to run along the other face of said sheet-shaped plasma stream, said film-forming surface of said substrate and said sheet-shaped plasma stream are made parallel with each other so as to confront each other, and the periphery of said plasma stream forms an envelope space surrounded by said substrate.

22. The apparatus for producing a magnetic recording medium according to claim 21, further comprising a gas supply for supplying said reactive gas into said envelope space.

23. The apparatus for producing a magnetic recording medium according to claim 21, wherein said three rolls located at the turn position at which said roll is arranged directly opposite said plasma stream may be preferably arranged to be as far from said plasma stream as possible so that film is not deposited or accumulated on said roll during the film-forming process.

* * * * *